United States Patent [19]
Mahoney

[11] B 3,921,056
[45] Nov. 18, 1975

[54] FREQUENCY MULTIPLIER CIRCUIT

[75] Inventor: Donald Edwin Mahoney, Hightstown, N.J.

[73] Assignee: RCA Corporation, New York, N.Y.

[22] Filed: Dec. 27, 1973

[21] Appl. No.: 428,795

[44] Published under the Trial Voluntary Protest Program on January 28, 1975 as document no. B 428,795.

[52] U.S. Cl. ............ 321/69 NL; 331/99; 333/84 M; 328/16
[51] Int. Cl.² ............ H02M 5/16
[58] Field of Search ............ 328/15, 16, 20, 38; 307/220; 321/69 NL; 331/99; 333/84 M

[56] References Cited

UNITED STATES PATENTS

| | | | |
|---|---|---|---|
| 3,479,615 | 11/1969 | Garver | 328/16 X |
| 3,582,760 | 6/1971 | Sun | 321/69 NL |
| 3,713,014 | 1/1973 | Wagner | 321/69 NL |

*Primary Examiner*—John S. Heyman
*Attorney, Agent, or Firm*—Edward J. Norton; Robert L. Troike

[57] ABSTRACT

Multiple transmission line center conductors having opposite ends capacitively coupled to a reference potential are arranged to match input and output impedances of a transistor having a parametric element for generating a desired output signal at a frequency harmonically related to an input signal frequency.

12 Claims, 4 Drawing Figures

FREQUENCY MULTIPLIER CIRCUIT

BACKGROUND OF THE INVENTION

1. Field of the Invention

This invention relates generally to frequency multiplier circuits and more particularly to transistor frequency multiplier circuits.

2. Description of the Prior Art

Frequency multiplier circuits using a varactor diode or a transistor having a parametric element for generating power at a frequency harmonically related to an input signal frequency are well known in the prior art. An article entitled "Designing Transistor Multipliers" by H. C. Lee and Robert Minton published in the November 1965 issue of Microwaves describes a single transistor which provides both frequency multiplication and gain at less cost and complexity than with varactor circuits. At microwave frequencies where lumped elements are not useable, prior art transistor frequency multiplier circuits used relatively long resonant distributed transmission lines or cavities for providing a necessary tuned circuit at a desired frequency of operation. Distributed transmission line elements for matching the transistor complex impedance to an input signal source impedance or a multiplier terminating load impedance increased the complexity of such prior art frequency multiplier circuits. There appears to be a need, therefore, to match the complex input and output impedance of a transistor having a parametric element by use of a relatively simple tuneable circuit operable at microwave frequencies.

SUMMARY OF THE INVENTION

According to the invention, a frequency multiplier is provided having a semiconductor device responsive to an input signal at an input frequency and D.C. bias signals for generating an output signal at a frequency harmonically related to the input frequency. A first terminal of the device is coupled to the second of first and second transmission line center conductors capacitively coupled to each other. Each of the first and second center conductors have opposite ends capacitively coupled to a common reference potential. A second terminal of the device is coupled to the reference potential and a third terminal of the device is coupled to a third transmission line center conductor which in turn is capacitively coupled to a fourth transmission line center conductor. Each of the third and fourth transmission line center conductors have opposite ends capacitively coupled to the reference potential.

The first and second transmission line center conductors are mutually arranged to match the input impedance of the device at the input frequency and the third and fourth transmission line center conductors are mutually arranged to match the output impedance of the device at the output signal frequency. The third transmission line center conductor is arranged to provide a relatively low impedance path to the reference potential at the input signal frequency and the fourth transmission line center conductor is arranged to be resonant at the output signal frequency.

DESCRIPTION OF THE PREFERRED EMBODIMENTS

It is well known in the art that a single transistor having a parametric element can be operated in a suitable circuit to provide both frequency multiplication and power gain. Such a parametric element is an element having a magnitude which varies nonlinearly in response to a sinusoidal input signal causing the element to produce a highly distorted charge or output current waveform. An overlay transistor is an example of one type of transistor having a parametric element. Such an overlay transistor is arranged to have P-N junctions with significant depletion layer capacitance (collector-to-base, $C_{bc}$, and base-to-emitter, $C_{be}$, capacitance) having a magnitude which varies nonlinearly in response to a voltage developed by the transistor. The nonlinear variation in the magnitude of $C_{bc}$ causes the transistor to generate the previously mentioned highly distorted current waveform which include components of fundamental and harmonic frequencies. Since a suitable transistor having an internal parametric element, $C_{bc}$, is capable of generating signals at harmonic frequencies, a signal at a desired harmonic frequency may be coupled from a suitable transistor parametric mode frequency multiplier having an output circuit resonant at the desired harmonic frequency of the operation, as will be explained in further detail below.

Transistor parametric mode frequency multipliers can be operated in either common-base (the transistor base electrode is connected to ground or reference potential) or common-emitter (the transistor emitter electrode is connected to ground potential). It should be noted that in a common-base transistor parametric mode frequency multiplier, the nonlinear collector-to-base transistor capacitance, $C_{bc}$, is connected in shunt with a suitable input circuit. In a common-emitter transistor parametric mode frequency multiplier, the nonlinear collector-to-base transistor capacitance, $C_{bc}$, is connected in series with a suitable input circuit. Common-base and common-emitter transistor parametric mode frequency multipliers and associated circuitry using lumped elements are further disclosed in U.S. Pat. No. 3,230,396 issued to G. L. Boelke on Jan. 18, 1966.

FIG. 1 (Prior Art)

Figure 1:
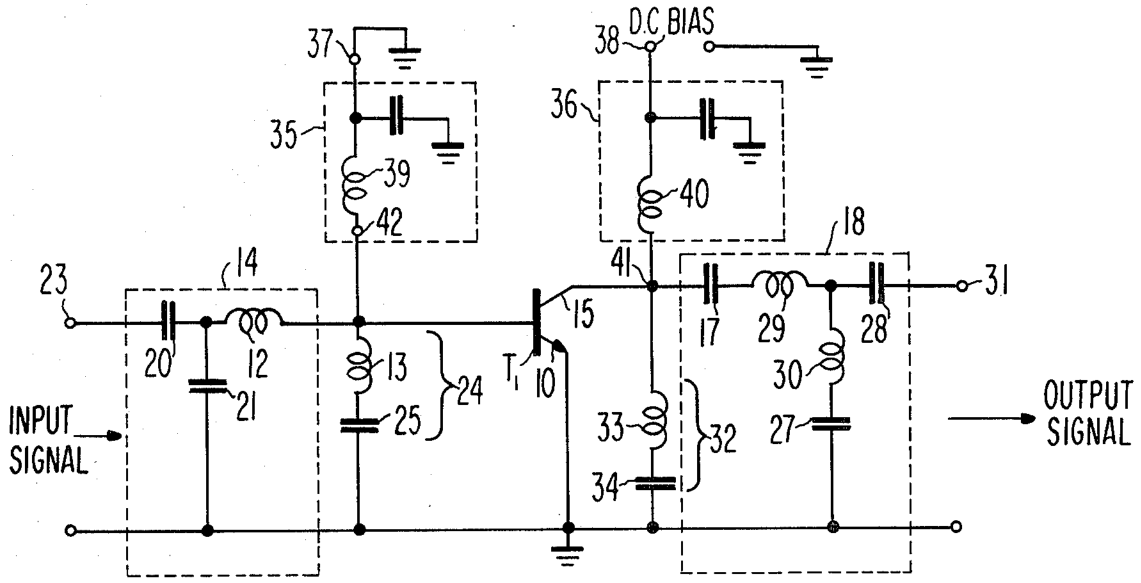
PRIOR ART FIG. 1
FIG. 1 is a simplified schematic of a prior art common-emitter transistor parametric mode frequency doubler.

Referring to FIG. 1, there is shown a schematic of a prior art common-emitter transistor parametric mode frequency doubler. Transistor $T_1$ is arranged so that emitter electrode 10 is connected to ground potential, base electrode 11 is connected to the junction of inductors 12 and 13 and collector electrode 15 is connected to capacitor 17. Input circuit 14 comprises a suitable matching section in a "T" configuration having capacitors 20 and 21 and inductor 12 suitably arranged to match, at input signal frequency $f_o$, the complex transistor input impedance across the transistor emitter-to-base junction to the impedance of an input signal source, not shown, coupled across input circuit terminal 23 and ground potential.

In a common-emitter transistor parametric mode frequency multiplier, a series resonant circuit 24 comprising inductor 13 and capacitor 25 is connected between base electrode 10 and ground potential. Series resonant circuit 24 is tuned to provide a relatively low impedance path to ground for signals at the desired harmonic frequency of multiplier operation. In a frequency doubler, circuit 24 is series resonant at the second harmonic, $2f_o$, of input frequency $f_o$. Thus, circuit 24 provides a relatively high impedance path to ground for signals at input frequency $f_o$ and a relatively low impedance path to ground at the second harmonic frequency $2f_o$. In addition, circuit 24 provides a ground return connection at the second harmonic frequency, $2f_o$, for the nonlinear transistor collector-to-base capacitance, $C_{bc}$, for improving the operation of the frequency doubler circuit. It should be noted, as will be appreciated and understood by those skilled in this art, that circuit 24 may not be used for optimizing a common-base transistor (as distinguished from a common-emitter transistor) parametric mode frequency multiplier.

Output circuit 18 is formed of capacitors 17, 27 and 28 and inductors 29 and 30 suitably arranged, as known in the art, to match the complex transistor output impedance across the collector-to-base junction at the desired second harmonic frequency to the impedance of a terminating load, not shown, coupled across terminal 31 and ground potential.

Series resonant circuit 32 comprising inductor 33 and capacitor 34 connected between transistor collector electrode 15 and ground potential is tuned to provide a relatively low impedance path to ground or to be resonant with transistor collector-to-base capacitance, $C_{bc}$, and to provide a path for circulating currents at input frequency $f_o$. Thus, series resonant circuit 32 is an idler circuit which enhances the operation of the frequency doubler circuit by providing a path for circulating currents at input frequency $f_o$. It should be appreciated that idler circuits resonant at other harmonically related frequencies could be included in output circuit 18 for enhancing multiplier operation at harmonic frequencies greater than the second harmonic frequency. For example, a second harmonic idler circuit would improve operation of a frequency tripler.

Bias circuits 35 and 36 are suitably arranged to provide a relatively low impedance path for appropriate D.C. bias signals and a relatively high impedance for signals at input frequency $f_o$ and output frequency $2f_o$. Thus, a relatively low impedance return path to ground for D.C. signals from transistor T, is provided by bias circuit 35 when one end 37 of inductor 39 is connected to ground and the other end is connected to base electrode 11. A relatively low impedance path for D.C. bias signals from a suitable source, not shown, to collector 15 is provided by bias circuit 36 when the D.C. bias signal is coupled to one end of inductor 40 and the other inductor end 41 is connected to transistor collector electrode 15. As known and practiced in the prior art, additional elements, not shown, may be included in bias circuits 35 and 36 for improving transistor operating stability and other bias circuit considerations.

In summary, it is well known that frequency multiplication and power gain can be provided by a suitably arranged lumped element circuit having a transistor with a parametric element. As an example, FIG. 1 describes a common-emitter transistor frequency doubler output having a lumped element input circuit arranged to match the transistor complex input impedance to an input signal source impedance. The doubler input circuit also includes a series resonant circuit connected from base electrode to ground and tuned to be resonant at the second harmonic of the input signal frequency $f_0$. In addition, the frequency doubler has a lumped element output circuit arranged to match the transistor complex output impedance to a doubler terminating load impedance. The doubler circuit also includes a series resonant circuit connected from collector electrode to ground and tuned to be resonant at the input signal frequency $f_o$.

Figure 2:
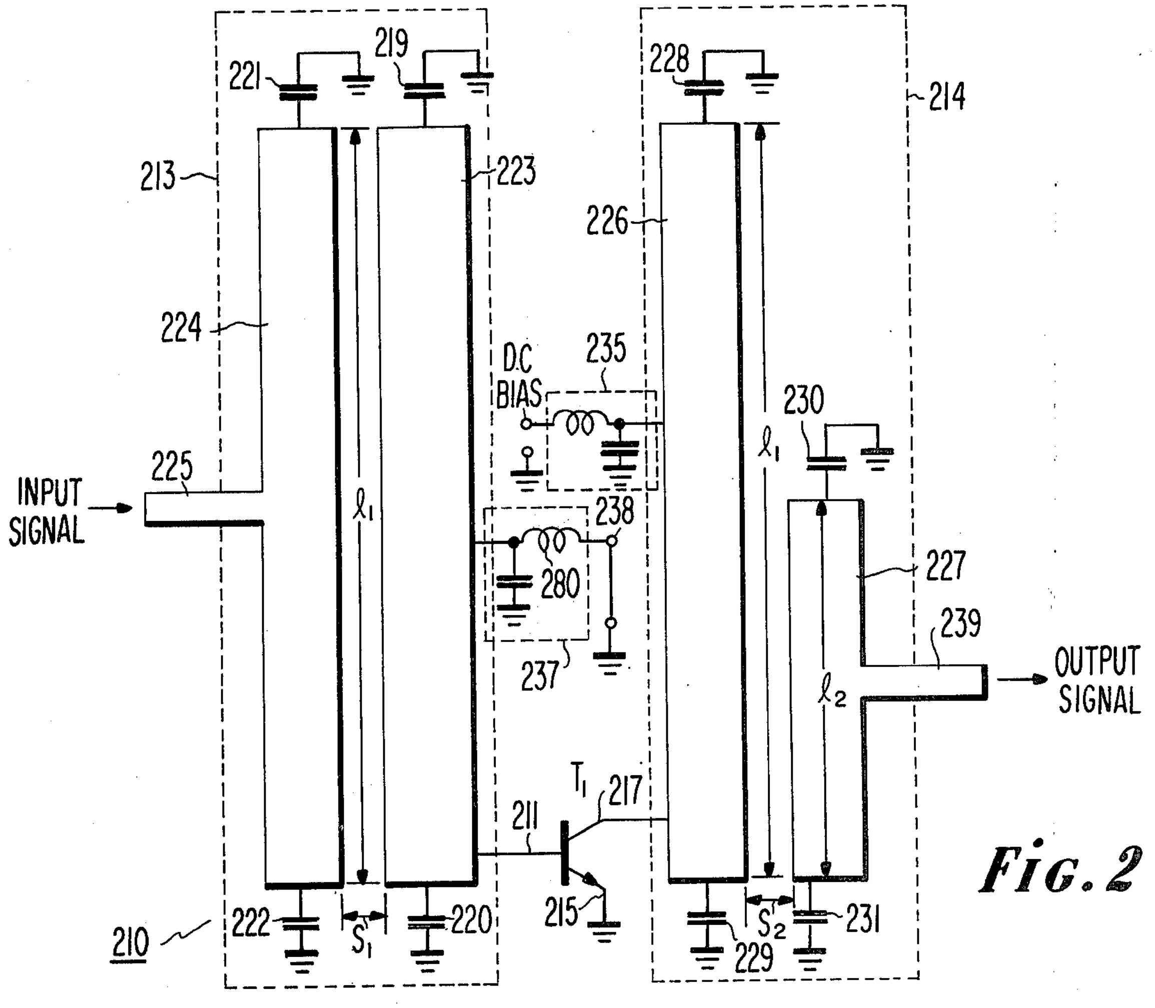
FIG. 2 is a schematic of a microwave transistor parametric mode frequency multiplier according to a preferred embodiment of the invention.

FIG. 2 (Preferred Embodiment)

Referring to FIG. 2, there is shown a schematic diagram of a microwave transistor parametric mode frequency multiplier 210 illustrating the nature and principles of the present invention. Multiplier 210 includes transistor $T_1$ connected between input section 213 and output section 214. Input section 213 is arranged, as will be further described, to provide an impedance match between the complex input impedance ($R_1 + jX_1$) presented by transistor $T_1$ and the impedance of an input signal source, not shown, coupled to center conductor 224 via conductor 225. Output section 214 is arranged, as will be further described, to provide an impedance match between the complex output impedance ($R_2 - jX_2$) presented by transistor $T_1$ and the impedance of a multiplier terminating load, not shown, coupled to center conductor 227 via conductor 239. It should be noted that input and output transistor impedance is substantially determined by the input signal and D.C. bias signals.

Input section 213 includes a first, capacitively loaded, resonant section of transmission line having a center conductor 223 with an electrical length, $l_1$, of substantially $\lambda/8$, where $\lambda$ is the wavelength at input signal frequency $f_o$. A suitable transmission line may be formed of a microstrip, stripline, coaxial or coplanar waveguide type transmission line all of which, as known in the art, having a center conductor for purposes to be described. Tuning capacitors 219 and 220 are disposed at opposite ends of center conductor 223. Capacitors 219 and 220 may be a prior art piston type variable capacitor or a type of capacitor constructed by use of distributed transmission line techniques well known in the art. Tuning capacitor 219 is, for convenience of illustration, schematically represented as a lumped capacitor having one terminal connected to ground potential and a second terminal coupled to one end of center conductor 223. Tuning capacitor 220 is also schematically represented as having one terminal coupled to the other end of transmission line 223.

A second, capacitively loaded, resonant section of transmission line having a center conductor 224 with an electrical length, $l_1$, of substantially $\lambda/8$, where $\lambda$ is the wavelength at input signal frequency $f_o$, is capacitively coupled to first transmission line 223. Capacitively coupling two lengths of transmission line center conductors to each other may be accomplished by separating the lengths of first and second center conductors 223 and 224, respectively, by a predetermined gap, $S_1$. This method of capacitively coupling two lengths of transmission line center conductors is further described in "Microwave Filters, Impedance-Matching Networks, and Coupling Structures" by George L. Matthaei et al., published by McGraw-Hill in 1964. Tuning capacitors 221 and 222 are disposed at opposite ends of center conductor 224.

The characteristic impedance of the transmission lines having center conductors 223 and 224, the gap, $S_1$, and the capacitive reactance provided by capacitors 219, 220, 221 and 222 are arranged to provide an impedance transformation or match from an impedance of an input signal source to the complex impedance presented by transistor $T_1$.

For purposes of illustration and not limitation, multiplier 210 is shown as a grounded emitter transistor frequency multiplier, wherein emitter electrode 215 is connected to ground potential. Base electrode 211 is coupled to one end of center conductor 223 in relatively close proximity to the coupling point of capacitor 220 and collector electrode 217 is coupled to one end of center conductor 226. As previously mentioned, in a common-emitter transistor parametric mode frequency multiplier, the nonlinear collector-to-base transistor capacitance, $C_{bc}$, is connected in series between input circuit 213 and output circuit 214. Center conductors 226 and 227 are included as elements in output multiplier section 214 as will be described more completely below.

A D.C. bias signal suitable for operating transistor $T_1$, for example +28 volts, is coupled to center conductors 226 via bias circuit 235. Under multiplier operating conditions, bias circuit 237 having one end of inductor 280 directly coupled to transmission line 223, provides a return path to ground potential for D.C. signals by connecting terminal 238 of bias circuit 237 (the other end of inductor 280) to ground potential. Bias circuits 235 and 237 are arranged, as known in the art, to provide a relatively low impedance conductive path for D.C. bias signals coupled to desired transistor terminals and a relatively high impedance or open circuit to microwave signals.

Under operating conditions, an input signal at frequency $f_o$ from a microwave signal source, not shown, is directly coupled to second center conductor 224 via conductor 225. For maximum power transfer and stable multiplier operation, the source impedance must match the complex impedance presented by the properly D.C. biased transistor, $T_1$, in frequency multiplier 210. It should be noted that unlike prior art frequency multiplier circuits of the type using a varactor diode having substantially only a nonlinear capacitive reactance as a device for generating harmonic frequencies in response to an input signal, frequency multiplier 210 of the present invention uses a transistor having a parametric mode of operation. Multiplier 210 uses a suitable pair of capacitively terminated center conductors (i.e. matching section 213) for providing an impedance match from source impedance to a complex impedance (i.e. an impedance having both real and reactive components) of the transistor.

Capacitor 220 is adjusted to provide a capacitive reactance which effectively cancels the inductive reactance presented by transistor $T_1$ when the transistor is properly biased by an appropriate D.C. bias signal and an input microwave signal having a predetermined magnitude. If either the D.C. bias signal or the input microwave signal magnitude is changed, the transistor inductive reactance or transistor complex impedance as known in the art, is thereby changed and capacitor 220 must be then readjusted accordingly.

As previously described, the characteristic impedance of the transmission lines having center conductors 223 and 224, the dimension, $S_1$, of the capacitive coupling gap between transmission lines 223 and 224, and the capacitive reactance of capacitors 219, 220, 221 and 222 are selected to provide a desirable impedance transformation or match from the input signal source impedance to the complex input impedance of transistor $T_1$ at input frequency $f_o$. Capacitors 219, 220, 221 and 222 are adjusted so that the transmission lines having center conductors 223 and 224 are tuned to be resonant at input frequency $f_o$. In addition, capacitors 219 and 220 are adjusted so that transmission line center conductor 223 and capacitors 219 and 220 provide a relatively low impedance path to ground for signals at a desired harmonic frequency, $nf_o$, of input frequency $f_o$.

Output matching section 214 is formed of a first capacitively loaded, resonant section of transmission line having a center conductor 226 with an electrical length, $l_1$, of substantially $\lambda/8$, where $\lambda$ is the wavelength at input signal frequency $f_o$. Tuning capacitors 228 and 229 are disposed at opposite ends of center conductor 226. As previously described, collector electrode 217 of transistor $T_1$ is coupled to one end of center conductor 226. Center conductor 226 is substantially electrically isolated from input circuit 213 at input frequency $f_o$ in a similar manner by being physically displaced from input circuit 213 in order to prevent amplifier instability or undesired oscillation due to coupling or feedback of the amplified output signal from transistor $T_1$ to input circuit 213.

A second capacitively loaded, resonant section of transmission line having center conductor 227 with an electrical length, $l_2$, of substantially $\lambda/8$, where $\lambda$ is the wavelength at an integral number, $n$, times the input frequency $f_o$ is included as an element in output circuit 214. Similarly, tuning capacitors 230 and 231 are disposed at opposite ends of center conductor 227.

In operation, the characteristic impedance of transmission lines having center conductors 226 and 227, the dimension, $S_2$, of the capacitive coupling gap between center conductors 226 and 227 and the capacitive reactance of capacitors 228, 229, 230 and 231 are arranged to provide a desired impedance transformation or match from the complex output impedance of transistor $T_1$ at output frequency, $nf_o$, to the multiplier terminating load impedance, not shown, coupled to center conductor 227 via conductor 239. Capacitors 228 and 229 are adjusted so that the transmission line having center conductors 226 is tuned to be resonant at input frequency $f_o$ and provide a path to ground for circulating currents at frequency $f_o$. Capacitors 230 and 231 are adjusted so that the transmission line having center conductor 227 is tuned to be resonant at output signal frequency $nf_o$.

Figure 3:
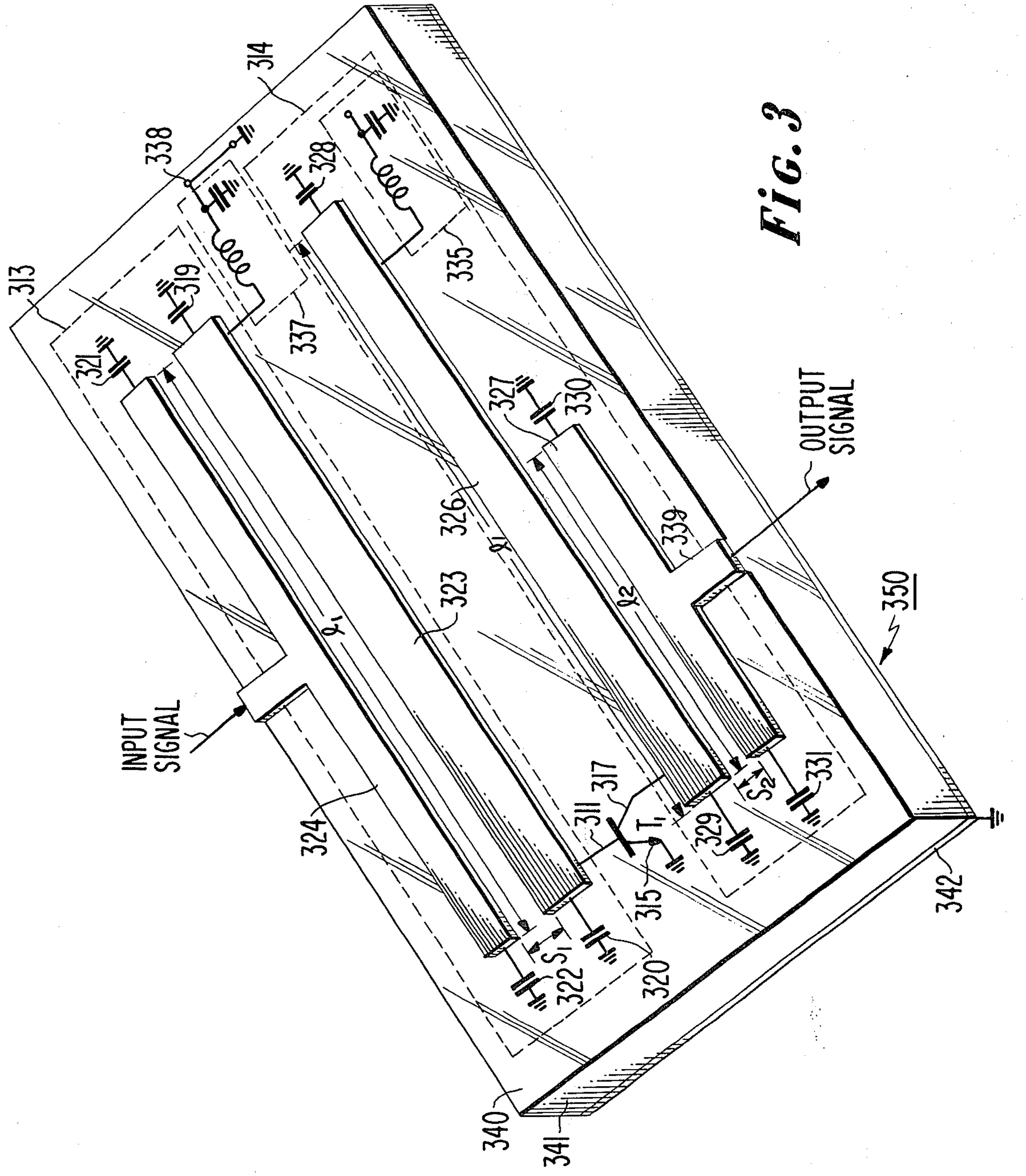
FIG. 3 is a top plan view of a microstrip transmission line microwave transistor parametric mode frequency doubler according to another embodiment of the invention.

FIG. 3 (Multiplier)

Referring to FIG. 3, there is shown a top plan view of a microstrip transmission line microwave transistor parametric mode frequency doubler embodying the invention illustrated in FIG. 2. Conductive strips 323, 324, 326 and 327 are formed on one surface 340 of a suitable dielectric substrate 341 having a conductive surface 342 at ground potential on the other face of substrate 341. Capacitors 319 and 320 are suitable fixed capacitor chips disposed at opposite ends of conductive strip 323 in a manner described above and illustrated in FIG. 2. Similarly, capacitors 321 and 322 are suitable fixed capacitor chips disposed at opposite ends of conductive strip 324. Emitter electrode 315 is connected to conductive surface 342 at ground potential. Base electrode 311 is coupled to an end of conductive strip 323. Collector electrode 317 is coupled to an end of conductive strip 326. The capacitive reactance provided by capacitors 319, 320, 321 and 322, the widths of conductive strips 323 and 324 and the gap, $S_1$, separating conductive strips 323 and 324 are chosen to provide an impedance transformation from a signal source impedance of 50 ohms, for example, to the impedance of properly biased transistors. The electrical length ($l_1$) of each of conductive strips 324, 323 and 326 is substantially $\lambda/8$, and the electrical length of conductive strip 327 ($l_2$) is substantially $\lambda/8$, where $\lambda$ is the microstrip transmission line wavelength at input signal frequency $f_o$ and $\lambda'$ is the microstrip wavelength at output signal frequency $2f_o$. Capacitor pair 328, 329, 330 and 331 are suitable fixed magnitude capacitor chips disposed at opposite ends of conductive strips 326 and 327 respectively. The capacitive reactance provided by capacitors 328, 329, 330 and 331, the widths of conductive strips 326 and 327, and the gap $S_2$, separating conductive strip 326 from conductive strip 327 are selected as described above in conjunction with FIG. 2, to provide an impedance transformation from a complex transistor output impedance at $2f_o$ presented by transistor $T_1$ to an amplifier terminating load impedance, not shown, coupled to conductive strip 339.

In operation, a D.C. bias signal of +28 volts from a battery or other suitable source, not shown, is coupled to collector electrode 317 via D.C. bias circuit 335. Terminal 338 of D.C. bias circuit 337 is connected to conductive surface 342 at ground potential. As known in the art, connectors for suitably coupling microwave signals to and from frequency doubler 350 may be connected to conductive strips 325 and 339.

Figure 4:
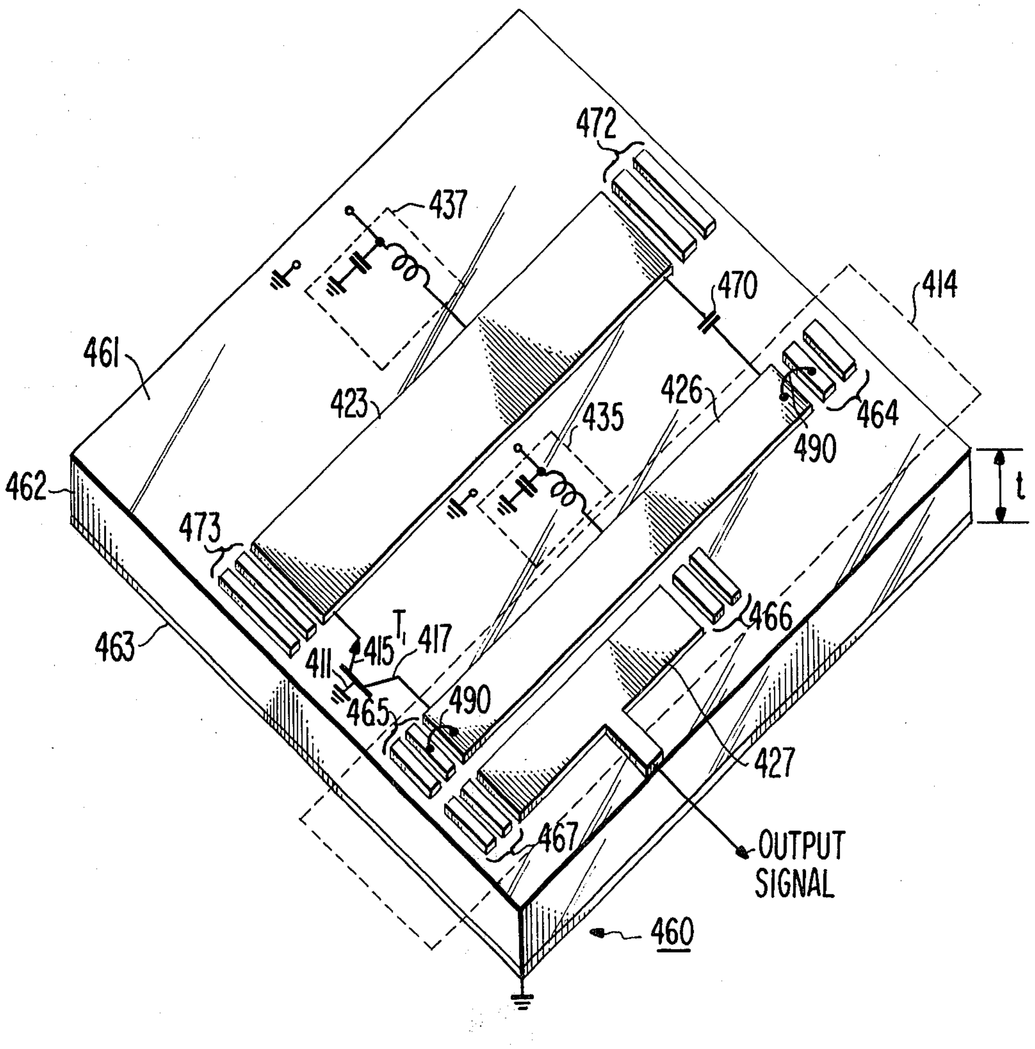
FIG. 4 is a top plan view of a microstrip transmission line transistor oscillator operable at the second harmonic of the fundamental frequency of oscillation according to still another embodiment of the invention.

FIG. 4 (Oscillator)

Referring to FIG. 4, there is shown a top plan view of another form of the invention embodied as a microstrip transmission line transistor oscillator 460 operable at the second harmonic of the fundamental frequency of transmission oscillation. Conductive strips 423, 426 and 427 are microstrip transmission line center conductors on one surface 461 of a suitable dielectric substrate 462 having an opposite conductive surface 463 at ground potential. Conductive strips 426 are arranged to form a transistor output circuit 414. Transistor output circuit 414 is arranged to be resonant at a desired frequency of oscillation of transistor $T_1$ and to provide an impedance transformation from the output impedance of transistor $T_1$ as previously described with respect to FIGS. 2 and 3. Conductive strips 464 and 465 disposed at opposite ends of conductive strip 426 are used to extend the electrical length of conductive strip 426, when suitably bonded or connected to conductive strip 426 as by bonding leads 490 as needed. The electrical length of conductive strip 426 can then be varied or adjusted from substantially $\lambda/8$, where $\lambda$ is the microstrip transmission line wavelength at the fundamental frequency of transistor oscillation to that electrical length which would resonate with the fringing capacitance present at the extremities of conductive strip

426. Fringing capacitance at the extremity of a microstrip transmission as further described on page 181 of the book "Microwave Filters, Impedance-Matching Networks, and Coupling Structures" by Matthaei et al., published by McGraw-Hill may be provided as an alternative to the fixed magnitude or tuneable piston type capacitors described above. In a similar manner, the electrical length of conductive strip 427 is extended from $\lambda'/8$ where $\lambda'$ is the microstrip wavelength at the desired harmonic frequency of operation, by bonding or connecting to conductive strip 427 conductive strips 466 and 467 disposed at opposite ends of conductive strip 427. Fringing capacitance may be used to resonate conductive strip 427 at the desired harmonic frequency of operation.

Emitter electrode 415 is connected to an end of conductive strip 423. Base electrode 411 is coupled to conductive strip 463 or ground potential and collector electrode 417 is coupled to conductive strip 426, in a manner similar to that described for FIGS. 2 and 3.

Conductive strips 472 and 473 disposed at opposite ends of conductive strip 423 are used to extend the electrical length of conductive strip 423 to a length resonant at the transistor fundamental frequency of oscillation when suitably bonded or connected to conductive strip 426 as described above for FIG. 3. Feedback capacitor 470 is connected between conductive strip 426 and one extremity of conductive strip 423. An example of a suitable feedback capacitor is a piston type capacitor well known in the art. Feedback capacitor 470 and conductive strip 423 provide a suitable oscillator feedback loop for feedback signals from transistor collector electrode 417 to transistor emitter electrode 415. It should be noted that in the embodiment of the invention as an oscillator, the combination of feedback capacitor 470 and the characteristic impedance of the resonant length of microstrip transmission line center conductor 423 is chosen to match the base-emitter impedance or input impedance of transistor $T_1$ to the collector-base impedance of transistor $T_1$ or the source of the feedback signals. Thus, unlike the transistor parametric mode frequency multiplier having center conductors 223 and 224 for transistor input impedance matching described in FIG. 2 only one center conductor 423 and feedback capacitor 470 are used for transistor input impedance matching is oscillator circuit 460 described in FIG. 4.

In operation the oscillator 460 of FIG. 4 oscillates when a D.C. bias is coupled to collector electrode 417 and emitter electrode 415 by suitable D.C. bias circuits 435 and 437 previously described with respect to FIG. 2. Although a microstrip transmission line has been used to illustrate the invention as an embodiment of a transistor oscillator operable at a harmonic of the fundamental frequency of transistor oscillation (460, FIG. 4), it is to be understood as will be appreciated by those skilled in this art that other types of microwave transmission line may be used, as for example, stripline transmission line, previously described.

In summary, according to the invention, a microwave apparatus provides for an input circuit having multiple capacitively terminated transmission lines for coupling an input signal to the electrodes of a transistor and an output circuit having multiple capacitively terminated transmission lines for providing a path for circulating currents at the input signal frequency and for coupling an amplified signal at a frequency harmonically related to the input signal from the transistor. In addition, according to the invention, the capacitively terminated transmission lines are arranged to provide an impedance match between a complex impedance presented by the transistor and the impedance of a signal source or apparatus terminating load.

It is to be understood that the disclosed impedance matching concepts are not limited to the common-emitter transistor frequency doubler described in FIGS. 2 and 3 and the oscillator circuit described in FIG. 4 but common-base and common-emitter transistor frequency multipliers operable at frequencies greater than the second harmonic frequency may be used in practicing the invention as will be apparent to those skilled in the art.

What is claimed is:

1. A frequency multiplier comprising:

first, second, third and fourth transmission line center conductors each having means for capacitively coupling opposite center conductors ends to a common reference potential, said first and second center conductors being capacitively coupled to each other and said third and fourth center conductors being capacitively coupled to each other; and a semiconductor device responsive to an input signal at an input frequency and D.C. bias signals for generating an output signal at a frequency harmonically related to said input frequency, said device having a predetermined input and output impedance, said device having a first terminal coupled to said second center conductor, a second terminal coupled to said reference potential and a third terminal coupled to said third center conductor, said first and second center conductors being arranged to match said input impedance of said device at said input frequency, said third and fourth center conductors being mutually arranged to match said output impedance of said device at said desired signal frequency with said third conductor providing a relatively low impedance path to said reference potential at said input frequency and said fourth center conductor being resonant at said desired signal frequency.

2. A frequency multiplier according to claim 1, further including:

means for coupling said input signal to said first center conductor;

means for coupling said desired signal from said fourth center conductor; and means for coupling said D.C. bias signals to said first and third device terminals.

3. A frequency multiplier according to claim 1, wherein said first, second, third and fourth transmission line center conductors are coplanar conductive strips on one surface of a dielectric substrate having a conductive strip at said reference potential on a dielectric surface opposite said one surface.

4. A frequency multiplier according to claim 1, wherein said semiconductor device is a transistor.

5. A frequency multiplier according to claim 1, wherein said second center conductor is arranged to provide a relatively low impedance path to said reference potential for said desired signal.

6. A frequency multiplier according to claim 1, wherein said input and input device impedance is substantially determined by said input signal and said D.C. bias signals.

7. A frequency multipiler comprising:

first, second, third and fourth coplanar conductive strips on one surface of a dielectric substrate having a conductive strip at a reference potential on a dielectric surface opposite said one surface, each of said conductive strips having means for capacitively coupling opposite conductive strip ends to said reference potential conductive strip, said first and second conductive strips being capacitively coupled to each other and said third and fourth conductive strips being capacitively coupled to each other; and a transistor responsive to an input signal at an input frequency and D.C. bias signals for generating an output signal at a frequency harmonically related to said input frequency, said transistor having a predetermined input and output impedance, said transistor having a first terminal coupled to said second conductive strip, a second terminal coupled to said reference potential conductive strip and a third terminal coupled to said third conductive strips, said first and second conductive strips being mutually arranged to match said input impedance of said transistor at said input frequency, said third and fourth conductive strips being mutually arranged to match said output impedance of said transistor at said desired signal frequency with said third conductive strip providing a relatively low impedance path to said reference potential at said input frequency and said fourth conductive strip being resonant at said desired signal frequency.

8. A frequency multiplier according to claim 7, wherein said input and output transistor impedance is substantially determined by said input signal and said D.C. bias signals.

9. An oscillator comprising:

first, second and third transmission line center conductors each having means for capacitively coupling opposite center conductor ends to a reference potential, said second and third center conductors being capacitively coupled to each other;

a semiconductive device responsive to D.C. bias signals for generating an input signal at an input frequency and a desired signal at a frequency harmonically related to said input frequency, said device having a predetermined input and output impedance, said device having a first terminal coupled to said first center conductor, a second terminal coupled to said reference potential and a third terminal coupled to said third center conductor, said second and third center conductors being mutually arranged to match said output impedance of said device at said desired signal frequency with said second center conductor providing a relatively low impedance path to said reference potential at said input frequency and said third center conductor being resonant at said desired signal frequency; and means for providing a path for signals at said input frequency from said first center conductor to said second center conductor.

10. An oscillator according to claim 9, further including:

means for coupling said D.C. bias signals to said first and third device terminals; and means for coupling said output signal from said third center conductor.

11. An oscillator according to claim 9, wherein said means for providing a path for said input signals at said input frequency from said first center conductor to said second center conductor include capacitor means having one terminal coupled to said first center conductor and a second terminal coupled to said second center conductor, said capacitor means being arranged with said first and second center conductors to match said input impedance of said device at said input signal frequency.

12. An oscillator according to claim 9, wherein said input and output device impedance is determined by said input signal and said D.C. bias signals.

* * * * *